United States Patent
Sunohara et al.

(10) Patent No.: US 12,488,966 B2
(45) Date of Patent: Dec. 2, 2025

(54) SUBSTRATE FIXING DEVICE

(71) Applicant: SHINKO ELECTRIC INDUSTRIES CO., LTD., Nagano (JP)

(72) Inventors: Masahiro Sunohara, Nagano (JP); Keita Sato, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 270 days.

(21) Appl. No.: 18/156,146

(22) Filed: Jan. 18, 2023

(65) Prior Publication Data

US 2023/0290621 A1    Sep. 14, 2023

(30) Foreign Application Priority Data

Jan. 20, 2022   (JP) .................................. 2022-006905

(51) Int. Cl.
*H01J 37/32* (2006.01)
*H02N 13/00* (2006.01)

(52) U.S. Cl.
CPC ....... *H01J 37/32715* (2013.01); *H02N 13/00* (2013.01); *H01J 2237/2007* (2013.01)

(58) Field of Classification Search
CPC ......... H01J 37/32715; H01J 2237/2007; H01J 37/20; H01J 37/32724; H02N 13/00; H01L 21/6833; H01L 21/68785; H01L 21/67248; H01L 21/67109; H01L 21/68757; H01L 21/683
See application file for complete search history.

(56) References Cited

U.S. PATENT DOCUMENTS

| | | | | |
|---|---|---|---|---|
| 9,960,067 B2 * | 5/2018 | Anada | ............... | H01L 21/67109 |
| 10,475,688 B2 * | 11/2019 | Ishimura | ........... | H01L 21/67103 |
| 10,497,600 B2 * | 12/2019 | Yamaguchi | ......... | H01L 21/6831 |
| 10,741,425 B2 * | 8/2020 | Hao | ................. | H01L 21/67248 |
| 10,923,381 B2 * | 2/2021 | Kosakai | ............ | H01L 21/67126 |

(Continued)

FOREIGN PATENT DOCUMENTS

| | | |
|---|---|---|
| JP | 2013-232641 A | 11/2013 |
| JP | 2015-195346 A | 11/2015 |

(Continued)

OTHER PUBLICATIONS

Japanese Information Offer corresponding to JP 2022-006905 dated Oct. 4, 2024, with English Translation, 10 pages.

(Continued)

*Primary Examiner* — Thienvu V Tran
*Assistant Examiner* — Muaamar Qahtan Al-Taweel
(74) *Attorney, Agent, or Firm* — Rankin, Hill & Clark LLP

(57) ABSTRACT

A substrate fixing device includes a base plate having a first through-hole penetrating through the base plate in a thickness direction of the base plate, a ceramic plate adhering to the base plate, having an electrode embedded in the ceramic plate and a second through-hole formed to communicate with the first through-hole, and configured to adsorb an adsorption target object by an electrostatic force that is generated when a voltage is applied to the electrode, an insulating plug arranged at a connection portion in the first through-hole connecting to the second through-hole, and a sealing member attached to the insulating plug and configured to seal a periphery of the connection portion.

13 Claims, 11 Drawing Sheets

(56) References Cited

U.S. PATENT DOCUMENTS

| | | | |
|---|---|---|---|
| 11,309,204 B2* | 4/2022 | Shiraishi | H01L 21/68757 |
| 11,417,556 B2* | 8/2022 | Shiraishi | H01L 21/68757 |
| 12,009,245 B2* | 6/2024 | Ishikawa | H01J 37/32715 |
| 2015/0279714 A1 | 10/2015 | Yamaguchi et al. | |
| 2017/0178944 A1 | 6/2017 | Yamaguchi et al. | |
| 2018/0025933 A1 | 1/2018 | Ishimura et al. | |
| 2019/0019714 A1 | 1/2019 | Kosakai et al. | |
| 2019/0131163 A1 | 5/2019 | Kuno et al. | |
| 2019/0287839 A1* | 9/2019 | Yamaguchi | H01L 21/6833 |
| 2021/0118716 A1* | 4/2021 | Ye | H01L 21/68785 |

FOREIGN PATENT DOCUMENTS

| | | |
|---|---|---|
| JP | 2020-072176 A | 5/2020 |
| JP | 2020-145281 A | 9/2020 |
| JP | 2021-044303 A | 3/2021 |
| JP | 2021-057468 A | 4/2021 |
| WO | 2016/132909 A1 | 8/2016 |
| WO | 2017/126534 A1 | 7/2017 |
| WO | 2018/216797 A1 | 11/2018 |

OTHER PUBLICATIONS

Japanese Office Action issued Jun. 17, 2025 in corresponding Japanese application No. 2022-006905; English machine translation included (10 pages).

* cited by examiner

SUBSTRATE FIXING DEVICE

CROSS-REFERENCE TO RELATED APPLICATIONS

This application claims priority from Japanese Patent Application No. 2022-006905, filed on Jan. 20, 2022, the entire content of which is incorporated herein by reference.

TECHNICAL FIELD

The present invention relates to a substrate fixing device.

BACKGROUND ART

In general, a substrate fixing device configured to adsorb and hold a wafer in the case of manufacturing a semiconductor component, for example, is also referred to as an electrostatic chuck (ESC), and includes a ceramic plate having an electrode embedded therein. The substrate fixing device has a structure where the ceramic plate is fixed to a base plate, and is configured to apply a voltage to the electrode embedded in the ceramic plate, thereby adsorbing the wafer on a surface of the ceramic plate by using an electrostatic force. By adsorbing and holding the wafer on the ceramic plate, processes such as microfabrication and etching on the wafer are efficiently performed.

In such a substrate fixing device, an inert gas such as helium (He) is introduced between the surface of the ceramic plate and the wafer as an adsorption target object to control a temperature of the wafer, in some cases. That is, in processes such as dry etching and film formation (sputtering and CVD) under plasma environment, for example, the temperature of the wafer may rise during processing. Therefore, in order to keep the temperature of the wafer constant, the inert gas such as He is introduced between the surface of the ceramic plate on which the wafer is adsorbed and the wafer and the wafer comes into contact with the inert gas, so that the temperature rise of the wafer is suppressed.

The inert gas is introduced from a gas hole provided in the substrate fixing device. FIG. 11 is a cross-sectional view showing a structure around the gas hole in the substrate fixing device. As shown in FIG. 11, the substrate fixing device is configured by bonding a ceramic plate 20 to a base plate 10 with an adhesive material 30. A communicating gas hole TH is formed in the base plate 10 and the ceramic plate 20, and the inert gas is discharged from the base plate 10 side through the gas hole TH to a surface of the ceramic plate 20.

The gas hole TH of the base plate 10 has a large diameter in the vicinity of a bonding portion with the ceramic plate 20, and an insulating plug 40 is bonded to an inner wall surface of the large diameter portion by an adhesive material 50. The insulating plug 40 is, for example, a porous body, and the inert gas passes through multiple holes of the insulating plug 40 and flows into the gas hole TH of the ceramic plate 20. By arranging the insulating plug 40, the inner wall surface of the gas hole TH of the base plate 10 is insulated, so that, for example, abnormal electric discharge from the plasma to the base plate 10 can be prevented.

CITATION LIST

Patent Literature

Patent Literature 1: JP2015-195346A
Patent Literature 2: JP2020-145281A
Patent Literature 3: WO2016/132909
Patent Literature 4: JP2021-044303A

SUMMARY

However, in the substrate fixing device configured as described above, there is a problem that the adhesive material for bonding the base plate and the ceramic plate flows into the gas hole, and therefore, the gas hole is clogged or narrowed. That is, for example, in the substrate fixing device shown in FIG. 11, when bonding the base plate 10 and the ceramic plate 20, the semi-cured adhesive material 30 flows into the gas hole TH, and therefore, the gas hole TH is completely clogged or narrowed. In addition, clogging of the holes of the insulating plug 40, which is a porous body, may occur. As a result, a flow rate of the inert gas in the gas hole TH decreases, so that the temperature control of the wafer adsorbed on the surface of the ceramic plate 20 may not be sufficiently performed.

Further, when the substrate fixing device is used under a plasma environment, there is also a problem that plasma flows into the gas hole TH, and therefore, the adhesive material 30 bonding the base plate 10 and the ceramic plate 20 is damaged and deteriorated. When the adhesive material 30 is deteriorated, the base plate 10 and the ceramic plate 20 are peeled off, and therefore, the substrate fixing device may be damaged prematurely.

The disclosed technology has been made in view of the above problems, and an object thereof is to provide a substrate fixing device capable of preventing premature damage while securing a sufficient flow rate of a gas.

According to one aspect of the present disclosure, there is provided a substrate fixing device including a base plate having a first through-hole penetrating through the base plate in a thickness direction of the base plate, a ceramic plate adhering to the base plate, having an electrode embedded in the ceramic plate and a second through-hole formed to communicate with the first through-hole, and configured to adsorb an adsorption target object by an electrostatic force that is generated when a voltage is applied to the electrode, an insulating plug arranged at a connection portion in the first through-hole connecting to the second through-hole, and a sealing member attached to the insulating plug and configured to seal a periphery of the connection portion.

According to one aspect of the substrate fixing device disclosed by the present disclosure, while securing a sufficient flow volume of the gas, it is possible to achieve the effect of preventing premature damage.

DESCRIPTION OF EMBODIMENTS

Hereinafter, one embodiment of the substrate fixing device disclosed by the present disclosure will be described in detail with reference to the drawings. Note that, the present invention is not limited to the embodiment.

Figure 1:
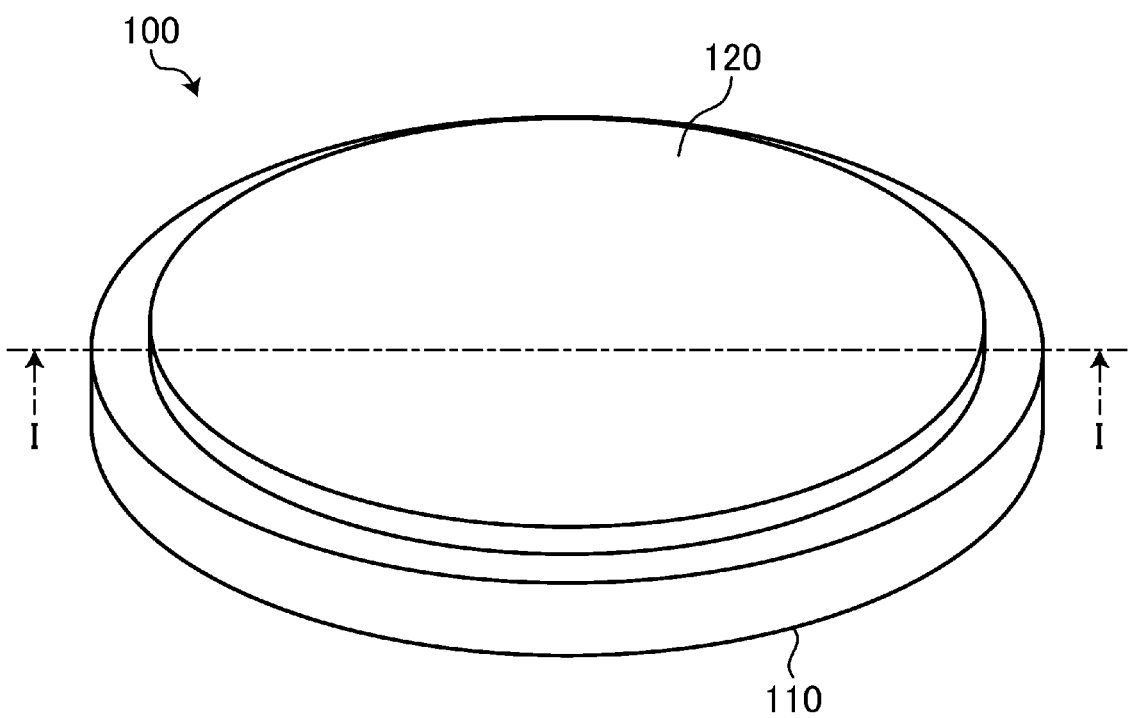
FIG. 1 is a perspective view showing a configuration of a substrate fixing device according to one embodiment.

FIG. 1 is a perspective view showing a configuration of a substrate fixing device 100 according to one embodiment. The substrate fixing device 100 shown in FIG. 1 has a structure where a ceramic plate 120 is bonded to a base plate 110.

The base plate 110 is a circular member made of metal such as aluminum, for example. The base plate 110 is a base member for fixing the ceramic plate 120. The base plate 110 is attached to a semiconductor manufacturing apparatus, for example, and causes the substrate fixing device 100 to function as a semiconductor holding device configured to hold a wafer.

The ceramic plate 120 has a conductive electrode embedded therein, and is configured to adsorb an adsorption target object such as a wafter by using an electrostatic force that is generated when a voltage is applied to the electrode. In addition, the ceramic plate 120 has an opening portion of a gas hole (not shown) in a surface on which the adsorption target object is adsorbed, and is configured to control a temperature of the adsorption target object by, for example, an inert gas such as helium (He) emitted from the opening portion. A diameter of the ceramic plate 120 is smaller than a diameter of the base plate 110, and the ceramic plate 120 is fixed to a center of the base plate 110. At this time, the ceramic plate 120 is bonded to the base plate 110 by an adhesive material made of, for example, silicone resin.

Figure 2:
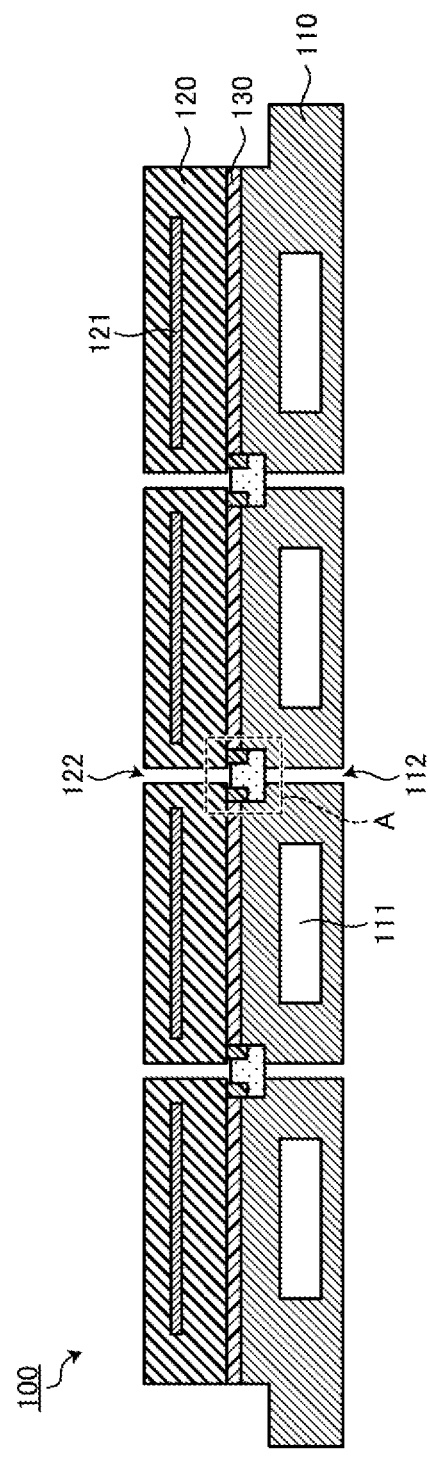
FIG. 2 is a schematic view showing a cross section of the substrate fixing device according to the embodiment.

FIG. 2 is a schematic view showing a cross section taken along a line I-I of FIG. 1. As shown in FIG. 2, the substrate fixing device 100 is configured by bonding the base plate 110 and the ceramic plate 120 with an adhesive material 130.

The base plate 110 is a circular member made of metal having a thickness of about 20 to 50 mm, for example. In the base plate 110, a cooling water channel 111 serving as a flow path of cooling water and a through-hole 112 serving as a flow path of the inert gas are formed.

The cooling water channel 111 is a flow path that circulates the inside of the base plate 110, and is configured to cool the ceramic plate 120 by the cooling water introduced from an outside of the substrate fixing device 100 into the cooling water channel 111. The ceramic plate 120 is cooled, so that the adsorption target object such as a wafer adsorbed on the surface of the ceramic plate 120 is cooled. Note that, the base plate 110 may have a cooling gas channel serving as a flow path of a cooling gas, instead of the cooling water channel 111. In addition, the base plate 110 may have a flow path of a heat-retaining medium, instead of the cooling water channel 111. That is, the base plate 110 has a passage of a medium for temperature adjustment of the ceramic plate 120 and the adsorption target object.

The through-hole 112 is a through-hole penetrating (passing) through the base plate 110 in a thickness direction of the base plate, and is formed to deliver, to a through-hole 122 of the ceramic plate 120, the inert gas such as He caused to flow into the through-hole 112 from the outside of the substrate fixing device 100. The through-hole 112 has an opening portion on the ceramic plate 120 side. The through-hole 112 has a spot facing portion having a larger diameter in the vicinity of the opening portion on the ceramic plate 120 side, and an insulating plug is arranged in the spot facing portion. An A structure in the drawing near the spot facing portion of the through-hole 112 will be described in detail later.

The ceramic plate 120 is a circular plate made of ceramic having a thickness of 4 to 6 mm, for example. The ceramic plate 120 can be obtained by firing a green sheet fabricated using aluminum oxide, for example. In the ceramic plate 120, a conductive electrode 121 and a through-hole 122 serving as a flow path of an inert gas are formed.

The electrode 121 is arranged in the ceramic plate 120, and is configured to generate an electrostatic force when a voltage is applied thereto. By the electrostatic force, the ceramic plate 120 adsorbs, on the surface, an adsorption target object such as a wafer.

The through-hole 122 is a through-hole penetrating through the ceramic plate 120 in a thickness direction, and is formed to communicate with the through-hole 112 of the base plate 110. That is, the through-hole 122 is formed to discharge the inert gas delivered from the through-hole 112 of the base plate 110, from the opening portion in the surface of the ceramic plate 120. Thereby, the adsorption target object on the surface of the ceramic plate 120 comes into contact with the inert gas, and the adsorption target object can be thus cooled.

The adhesive material 130 is made of, for example, silicone resin or epoxy resin, and bonds the base plate 110 and the ceramic plate 120 to each other. The adhesive material 130 is provided between the base plate and the ceramic plate. As described later, since a connection portion of the through-hole 112 and the through-hole 122 is sealed by a sealing member arranged at the periphery of the insulating plug, the adhesive material 130 does not enter the through-hole 112 or the through-hole 122.

Figure 3:
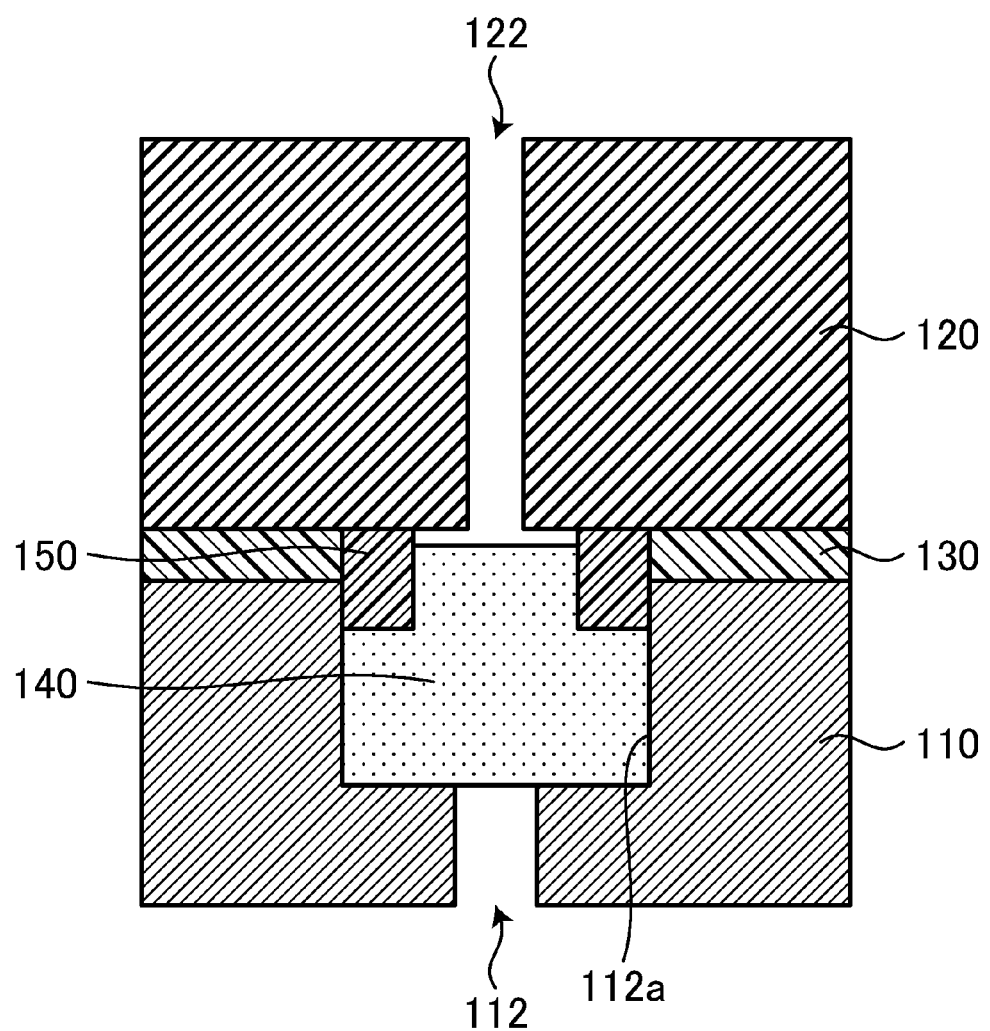
FIG. 3 is an enlarged view showing a cross section of the substrate fixing device according to the embodiment.

FIG. 3 is an enlarged view of an A part of FIG. 2. That is, FIG. 3 is an enlarged view showing the connection portion of the through-hole 112 of the base plate 110 and the through-hole 122 of the ceramic plate 120.

As shown in FIG. 3, the through-hole 112 of the base plate 110 has a larger diameter at the connection portion connected to the through-hole 122 of the ceramic plate 120, and a spot facing portion is thus formed. An insulating plug 140 is arranged in the spot facing portion, and a sealing member 150 is from above in press contact with a peripheral edge portion of an upper surface of the insulating plug 140. Note that, although a direction in which the ceramic plate 120 is positioned with respect to the base plate 110 is herein described as an upper direction, the substrate fixing device 100 may be manufactured and used in an arbitrary position, such as being vertically inverted, for example.

The insulating plug 140 is, for example, a porous body made of ceramic, and is configured to cause the inert gas introduced into the through-hole 112 to pass through a plurality of holes and to deliver the same to the through-hole 122 of the ceramic plate 120. The insulating plug 140 has such a shape that a lower portion has a cylindrical shape having substantially the same diameter as a diameter of the spot facing portion and an upper portion has a cylindrical shape having a diameter smaller than the diameter of the spot facing portion. That is, the insulating plug 140 has such a shape that cylinders of two stages having different diameters are overlapped, and the sealing member 150 is in press contact with a stepped portion. Since the insulating plug 140 is pressed in the direction toward the base plate 110 by the sealing member 150, the insulating plug 140 does not adhere to an inner peripheral surface 112a of the spot facing portion. That is, the insulating plug 140 is fixed to the spot facing portion by the pressure from the sealing member 150 without adhering to the base plate 110.

The sealing member 150 is a ring-shaped member made of, for example, silicone resin, fluorine-based resin, elastomer resin, epoxy resin, polyimide resin, acrylic resin, phenol resin, liquid crystal polymer or the like, and is configured to seal the periphery of the connection portion of the through-hole 112 and the through-hole 122. The sealing member 150 is in contact with the ceramic plate 120 to separate a space in which the insulating plug 140 is arranged from a space in which the adhesive material 130 is arranged. Specifically, the sealing member 150 is attached to the peripheral edge portion of the upper surface of the insulating plug 140, so that an upper end surface of the sealing member 150 is in contact with a lower surface of the ceramic plate 120 and a lower end surface of the sealing member 150 is in press contact with the peripheral edge portion of the upper surface of the insulating plug 140. Since the sealing member 150 presses the insulating plug 140 downward by the adhesive force of the adhesive material 130 bonding the base plate 110 and the ceramic plate 120, the sealing member 150 can fix the insulating plug 140 to the spot facing portion without adhesion. That is, the insulating plug 140 is fixed to the base plate 110 without using an adhesive material in a state where the insulating plug 140 is located in the through-hole 112 of the base plate 110.

As the material of the sealing member 150, it is preferable to use a material excellent in sealing property, heat resistance and plasma resistance, such as the various resins described above. For example, since the silicone resin and the elastomer resin are excellent in sealing property, when the sealing member 150 is formed using the silicone resin or elastomer resin, the sealing property can be improved. In addition, for example, since the fluorine-based resin is excellent in plasma resistance, when the sealing member 150 is formed using the fluorine-based resin, deterioration of the sealing member 150 due to plasma can be suppressed. Further, for example, since the polyimide resin is excellent in heat resistance, when the sealing member 150 is formed using the polyimide resin, deformation or damage can be suppressed even when the sealing member 150 is heated by, for example, a heater for keeping warm the adsorption target object.

Figure 4:
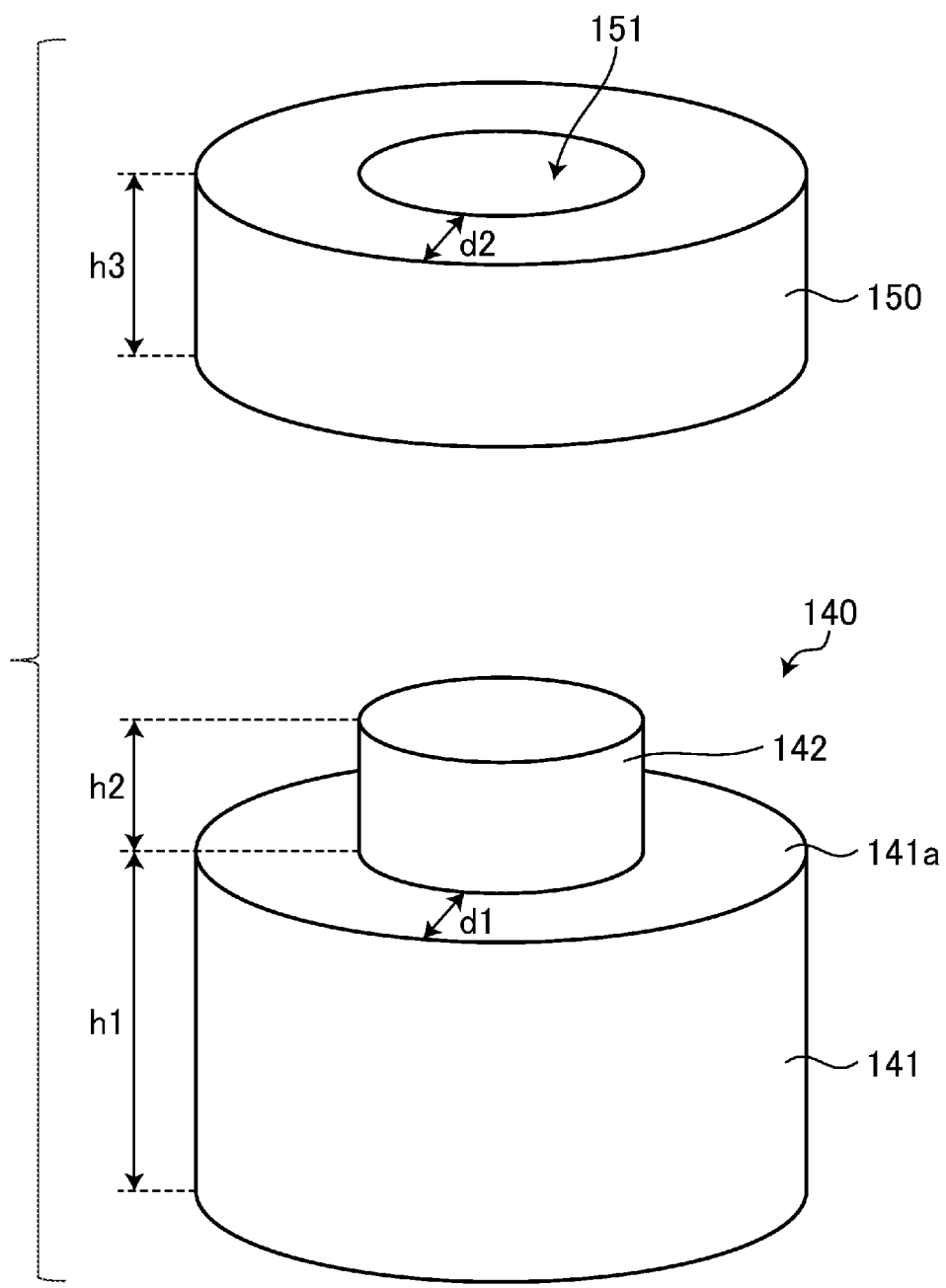
FIG. 4 is a view showing a specific example of an insulating plug and a sealing member.

FIG. 4 is an exploded view showing a specific example of the insulating plug 140 and the sealing member 150. As shown in FIG. 4, the insulating plug 140 has such a shape that a large-diameter portion 141 having a cylindrical shape whose diameter is substantially the same as the diameter of the spot facing portion and a small-diameter portion 142 having a cylindrical shape whose diameter is smaller than the diameter of the spot facing portion are overlapped. Due to the difference in diameter of the two-stage cylindrical shape forming the insulating plug 140, an upper surface 141a of the large-diameter portion 141 is exposed to form a stepped portion.

On the other hand, the sealing member 150 is an annular ring-shaped member having a through-hole 151 at a center, and is attached to the insulating plug 140 by inserting the small-diameter portion 142 of the insulating plug 140 into the through-hole 151. That is, when the lower end surface of the sealing member 150 is brought into contact with the upper surface 141a of the large-diameter portion 141 and the insulating plug 140 is fitted to the spot facing portion in this state, the upper end surface of the sealing member 150 is brought into contact with the lower surface of the ceramic plate 120.

Since a height h1 of the large-diameter portion 141 of the insulating plug 140 is smaller than a depth of the spot facing portion of the through-hole 112, the upper surface 141a of the large-diameter portion 141 is at a position lower than the upper surface of the base plate 110. That is, the large diameter portion 141 is completely accommodated in the spot facing portion of the through-hole 112. Also, a height h2 of the small-diameter portion 142 of the insulating plug 140 is, for example, about 0.2 to several mm, and is larger than a thickness of the adhesive material 130. For this reason, a lower end of the small-diameter portion 142 reaches a position lower than the upper surface of the base plate 110, and is located flush with the upper surface 141a of the large-diameter portion 141. A height h3 of the sealing member 150 is equal to or greater than the height h2 of the small-diameter portion 142, and the small-diameter portion 142 does not protrude from the through-hole 151 in a state in which the sealing member 150 is placed on the upper surface 141a of the large-diameter portion 141. That is, a gap is provided between the insulating plug 140 and the ceramic plate 120 in the thickness direction of the base plate 110.

A width d1 of the stepped portion due to the difference in diameters of the large-diameter portion 141 and the small-diameter portion 142 of the insulating plug 140 is, for example, about 0.1 to several mm. Also, a width d2 of the annular ring excluding the through-hole 151 of the sealing member 150 is equal to or greater than the width d1 of the stepped portion, and the upper surface 141a is covered without being exposed in the state where the sealing member 150 is placed on the upper surface 141a of the large-diameter portion 141. At this time, a side surface of the small-diameter portion 142 may not be necessarily completely covered by an inner peripheral surface of the through-hole 151 of the sealing member 150. That is, the inner peripheral surface of the through-hole 151 may have, for example, a convex curved surface shape, and may cover only a central portion of the side surface of the small-diameter portion 142, or the inner peripheral surface of the through-hole 151 may have, for example, a concave curved surface shape, and may cover only upper and lower end portions of the side surface of the small-diameter portion 142.

In this way, since the sealing member 150 surrounding the small-diameter portion 142 covers the upper surface 141a of the large-diameter portion 141, when the insulating plug 140 is fitted in the spot facing portion of the through-hole 112, a space between the upper surface 141a of the large-diameter portion 141 and the lower surface of the ceramic plate 120 is filled by the sealing member 150. That is, the upper end surface of the sealing member 150 is in contact with the lower surface of the ceramic plate 120, and the lower end surface is in press contact with the upper surface 141a of the large-diameter portion 141. For this reason, it is possible to fix the insulating plug 140 to the spot facing portion by a pressure from the sealing member 150 without bonding the insulating plug 140 to the base plate 110.

In addition, the periphery of the connection portion of the through-hole 112 and the through-hole 122 is sealed, and as a result, the adhesive material 130 does not enter the through-hole 112 and the through-hole 122, so that the through-hole 112 and the through-hole 122, which are flow paths of the inert gas, can be prevented from being clogging and narrowed. Similarly, since the adhesive material 130 is not in contact with the insulating plug 140, the inflow of the adhesive material 130 into the holes of the porous insulating plug 140 can be prevented. Further, even when the plasma flows into the through-hole 122 of the ceramic plate 120, the plasma does not come into contact with the adhesive material 130, and therefore, deterioration of the adhesive material 130 can be suppressed. Accordingly, peeling of the base plate 110 and the ceramic plate 120 can be prevented.

As described above, according to the present embodiment, the insulating plug having the large-diameter portion and the small-diameter portion is arranged and the sealing member surrounding the small-diameter portion is arranged at the connection portion of the through-holes of the ceramic plate and the base plate, which are flow paths of the inert gas, so that the periphery of the connection portion of the through-holes is sealed. For this reason, the insulating plug can be pressed by the sealing member and fixed to the base plate without adhesion. In addition, the adhesive material for bonding the base plate and the ceramic plate does not enter the flow path of the inert gas, so that clogging and narrowing of the flow path is prevented and a sufficient flow rate of gas is secured. Further, the plasma flowing into the flow path of the inert gas from the outside does not come into contact with the adhesive material, so that deterioration of the adhesive material is suppressed and premature damage of the substrate fixing device can be prevented.

Note that, the shapes of the insulating plug 140 and the sealing member 150 described in the above embodiment can be changed variously. In the below, modified embodiments of the substrate fixing device 100 will be specifically described.

Figure 5:
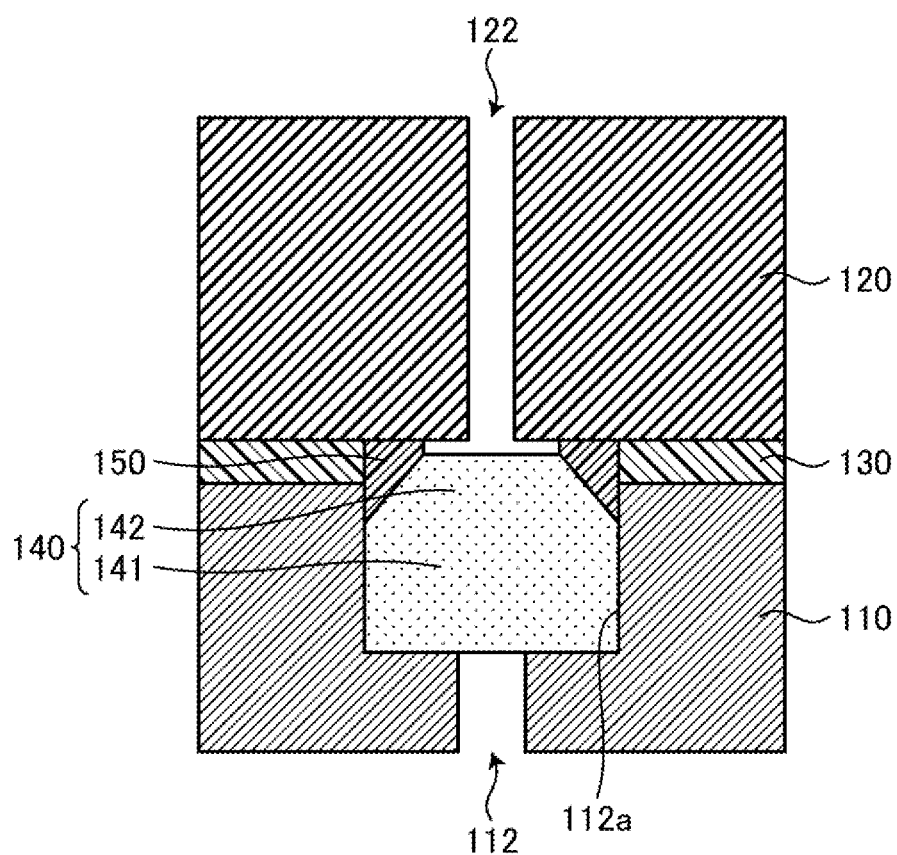
FIG. 5 is a view showing a first modified embodiment of the substrate fixing device.

FIG. 5 is a view showing a first modified embodiment of the substrate fixing device 100. In FIG. 5, the same parts as those in FIG. 3 are denoted with the same reference signs.

In the modified embodiment shown in FIG. 5, the small-diameter portion 142 of the insulating plug 140 has a truncated conical shape. For this reason, the lower end surface of the sealing member 150 is made as an inclined surface corresponding to the side surface of the small-diameter portion 142. In this way, the insulating plug 140 can be formed only by taper processing, so that the processing cost can be reduced and damage to the insulating plug 140 due to the pressure applied to the insulating plug 140 from the sealing member 150 can be prevented.

Figure 6:
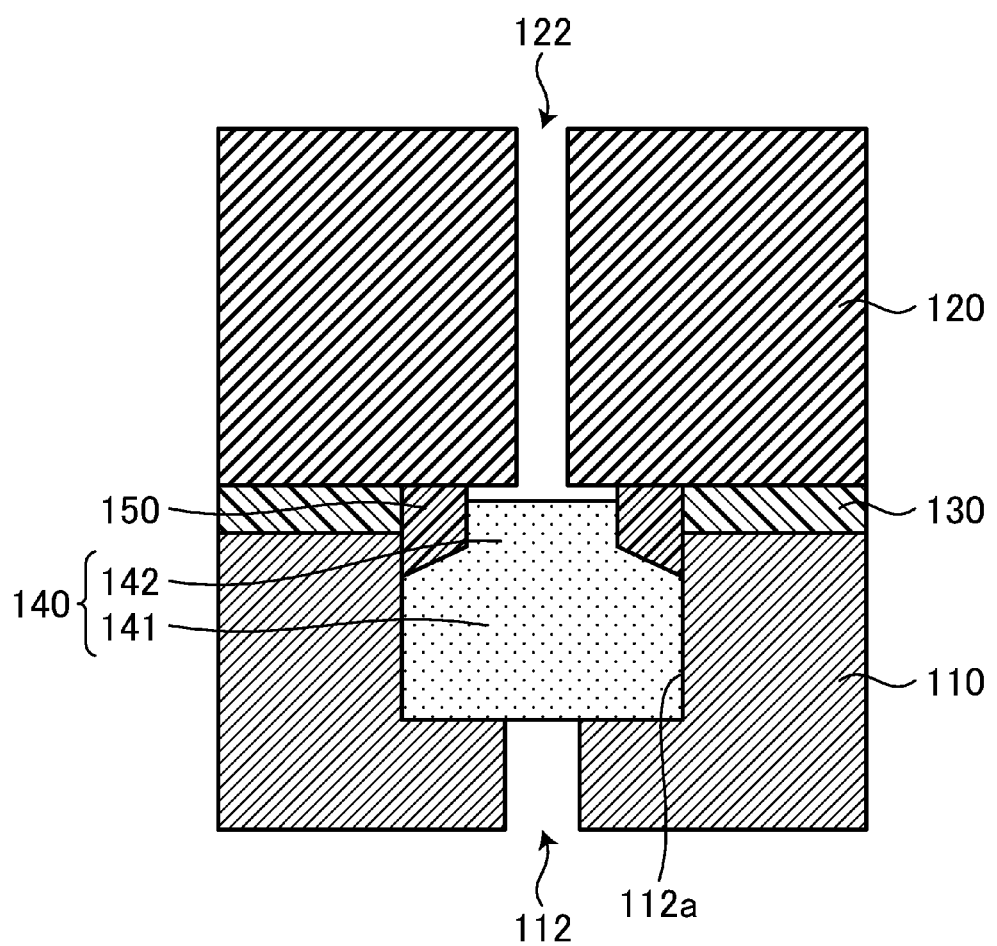
FIG. 6 is a view showing a second modified embodiment of the substrate fixing device.

FIG. 6 is a view showing a second modified embodiment of the substrate fixing device 100. In FIG. 6, the same parts as those in FIG. 3 are denoted with the same reference signs.

In the modified embodiment shown in FIG. 6, the large-diameter portion 141 and the small-diameter portion 142 of the insulating plug 140 are overlapped via a truncated cone. For this reason, the lower end surface of the sealing member 150 is made as an inclined surface corresponding to the side surface of the truncated cone. In this way, as compared with the first modified embodiment shown in FIG. 5, the insulating plug 140 can be fixed reliably by the sealing member 150.

Figure 7:
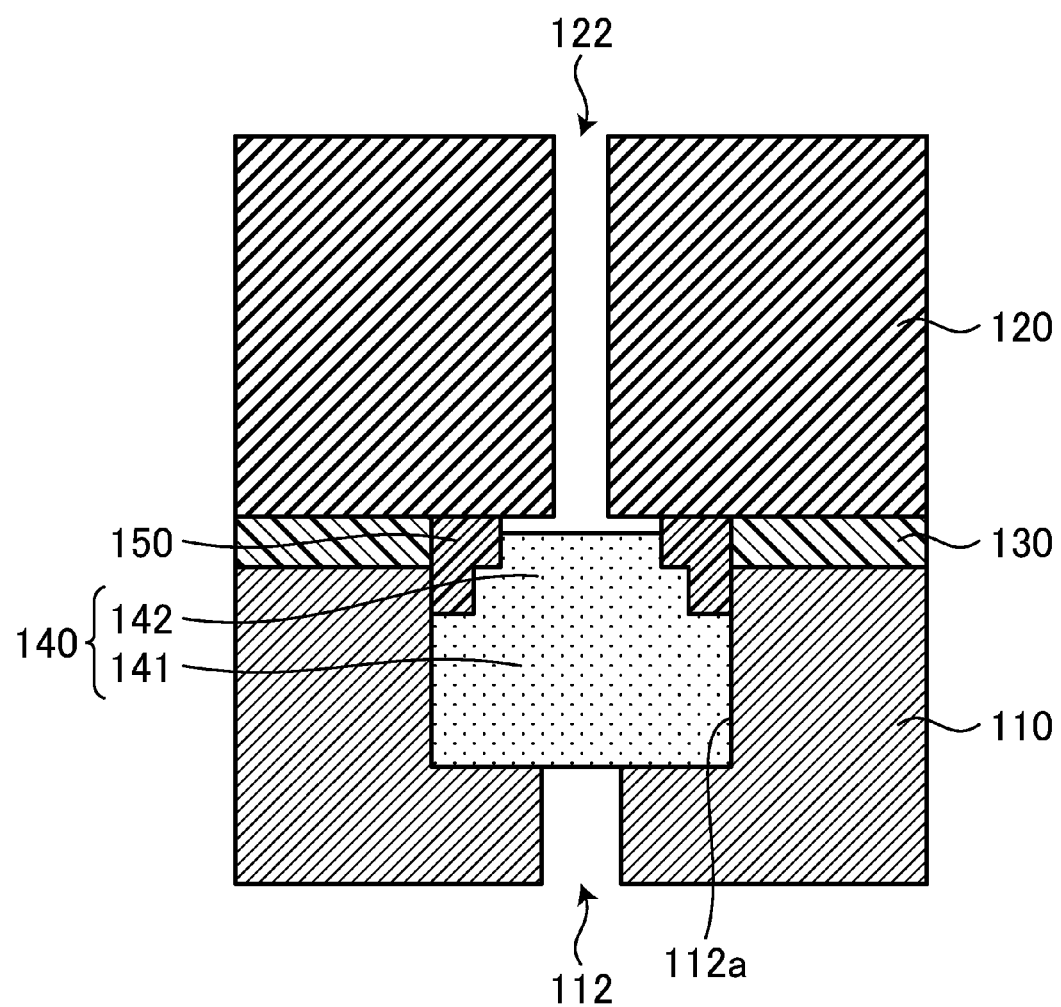
FIG. 7 is a view showing a third modified embodiment of the substrate fixing device.

FIG. 7 is a view showing a third modified embodiment of the substrate fixing device 100. In FIG. 7, the same parts as those in FIG. 3 are denoted with the same reference signs.

In the modified embodiment shown in FIG. 7, the small-diameter portion 142 of the insulating plug 140 has a cylindrical shape of two stages having different diameters. That is, the small-diameter portion 142 has a first small-diameter cylinder overlapping above the large-diameter portion 141 and having a diameter smaller than the large-diameter portion 141, and a second small-diameter cylinder overlapping above the first small-diameter cylinder and having a diameter smaller than the first small-diameter cylinder. For this reason, the lower end surface of the sealing member 150 has a step corresponding to the step of the small-diameter portion 142. In this way, the sealing property by the sealing member 150 can be improved.

Figure 8:
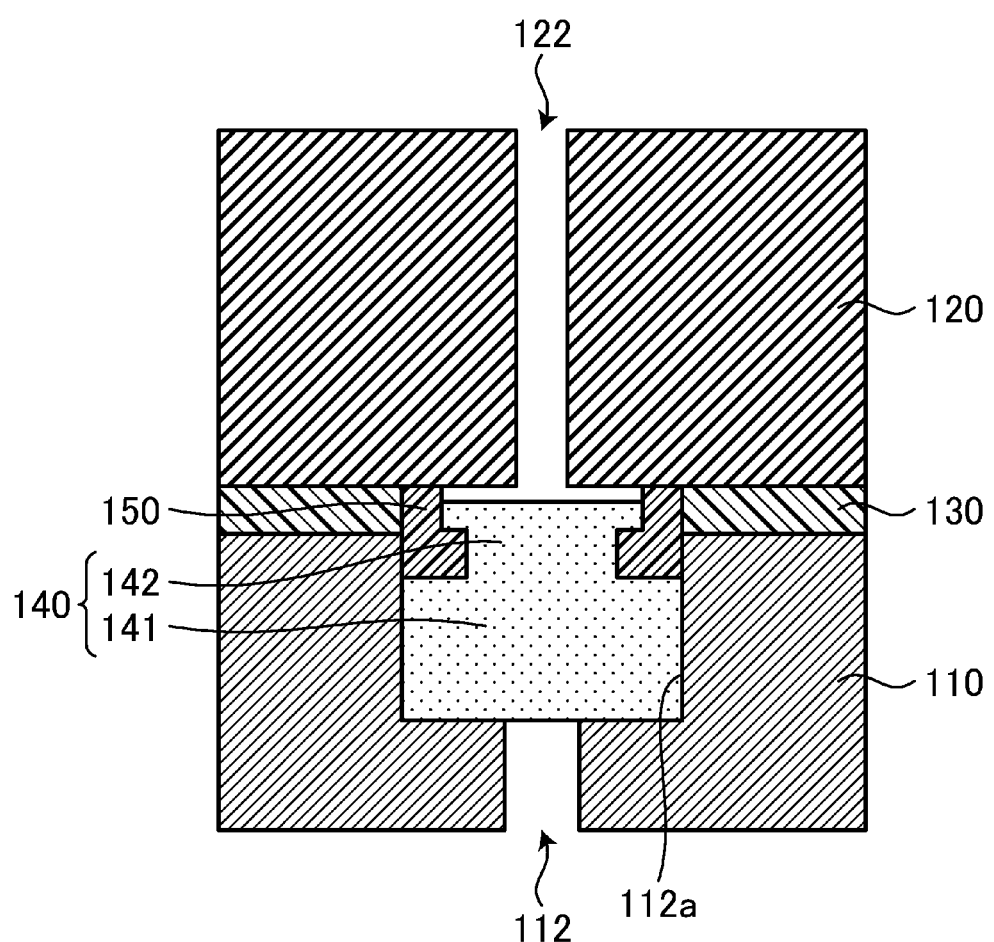
FIG. 8 is a view showing a fourth modified embodiment of the substrate fixing device.

FIG. 8 is a view showing a fourth modified embodiment of the substrate fixing device 100. In FIG. 8, the same parts as those in FIG. 3 are denoted with the same reference signs.

In the modified embodiment shown in FIG. 8, the small-diameter portion 142 of the insulating plug 140 has a cylindrical shape of two stages having different diameters. That is, the small-diameter portion 142 has a first small-diameter cylinder overlapping above the large-diameter portion 141 and having a diameter smaller than the large-diameter portion 141, and a second small-diameter cylinder overlapping above the first small-diameter cylinder and having a diameter smaller than the large-diameter portion 141 and larger than the first small-diameter cylinder. For this reason, the upper end surface of the sealing member 150 has a step corresponding to a step of the small-diameter portion 142. In this way, the sealing property by the sealing member 150 can be improved.

Figure 9:
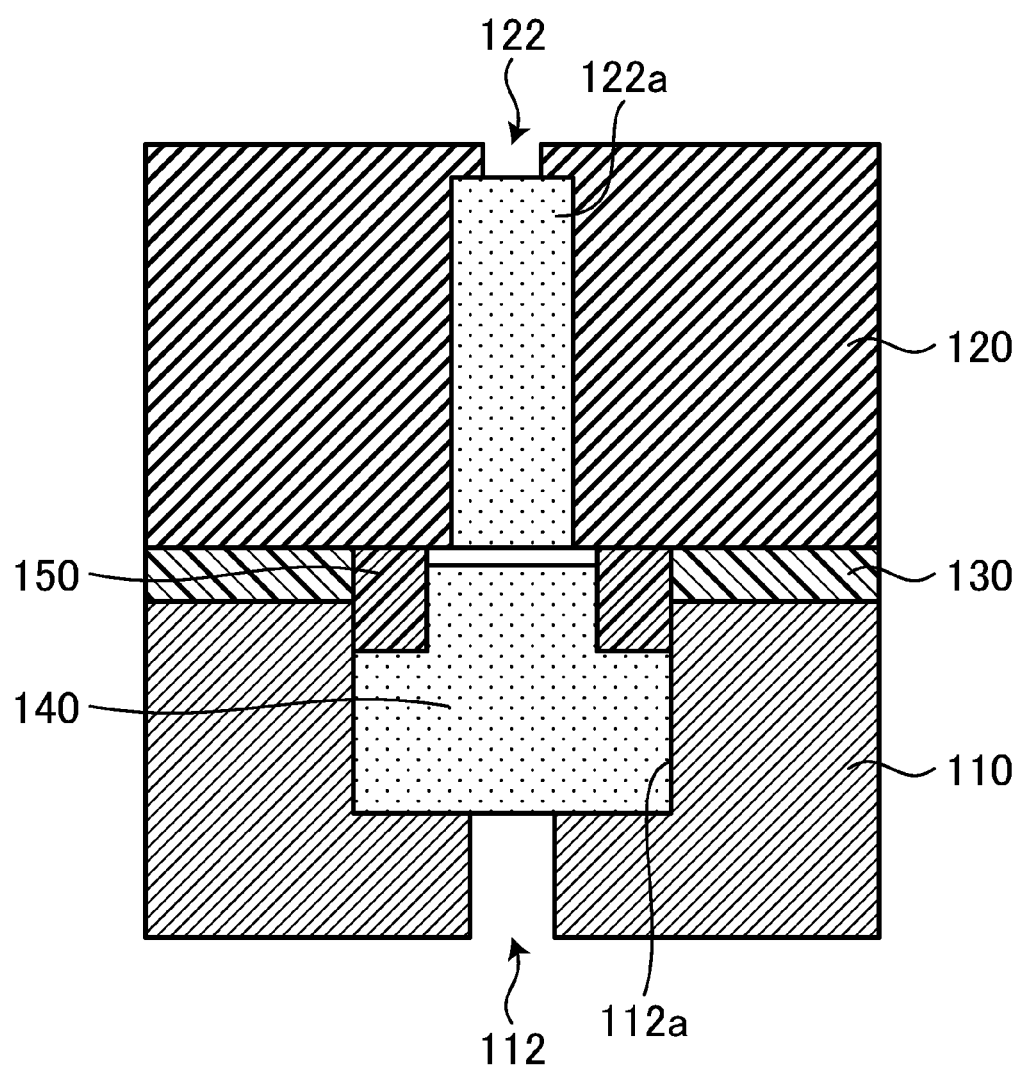
FIG. 9 is a view showing a fifth modified embodiment of the substrate fixing device.

FIG. 9 is a view showing a fifth modified embodiment of the substrate fixing device 100. In FIG. 9, the same parts as those in FIG. 3 are denoted with the same reference signs.

In the modified embodiment shown in FIG. 9, a porous plug 122a is arranged in the through-hole 122 of the ceramic plate 120. The porous plug 122a is a porous body made of, for example, ceramic, similarly to the insulating plug 140. In this way, even when the porous plug 122a is arranged in the through-hole 122, since the periphery of the connection portion of the through-hole 112 and the through-hole 122 is sealed by the sealing member 150, the adhesive material 130 does not come into contact with the porous plug 122a, so that inflow of the adhesive material 130 into the holes of the porous plug 122a can be prevented.

Figure 10:
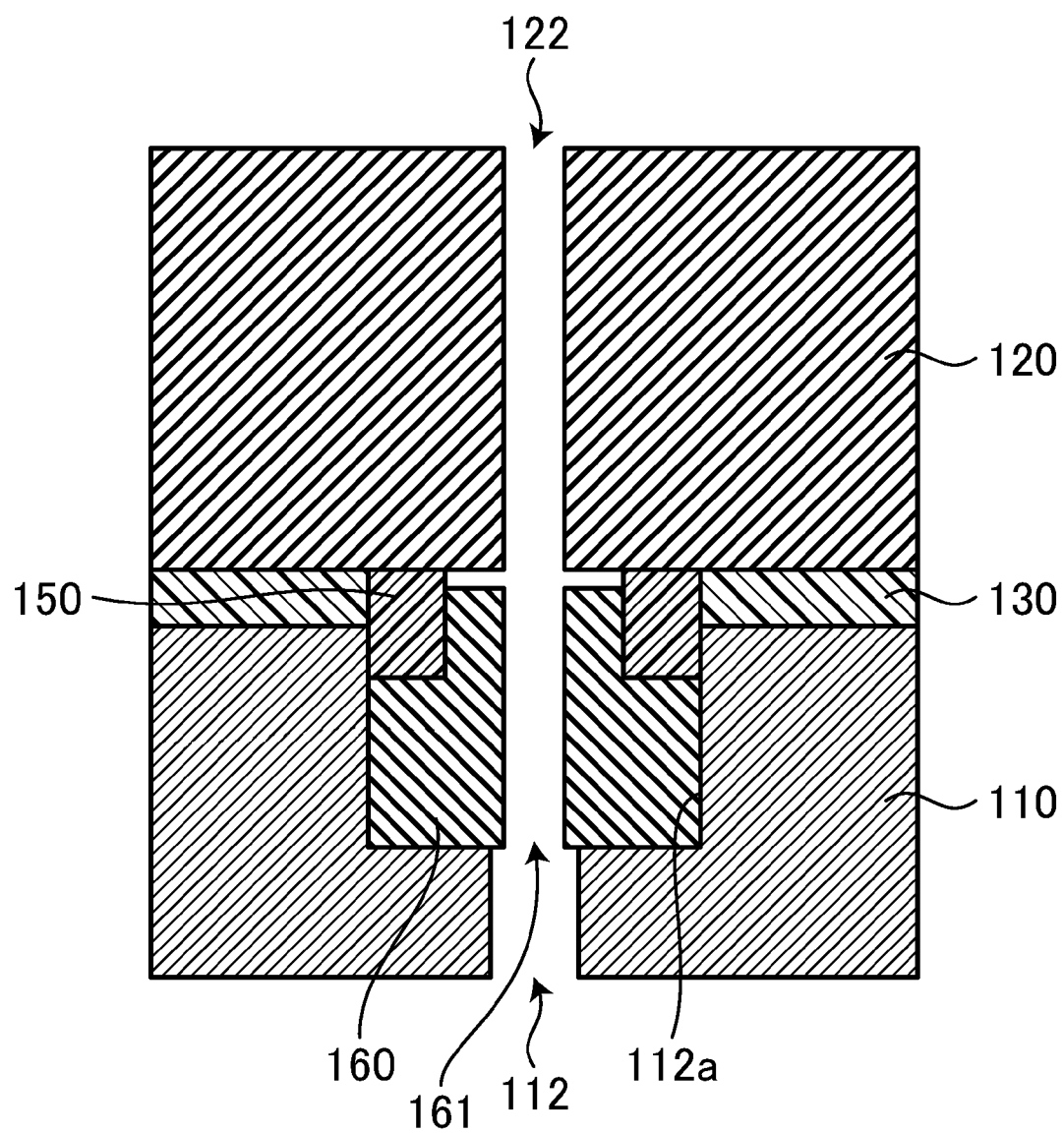
FIG. 10 is a view showing a sixth modified embodiment of the substrate fixing device.
Figure 11:
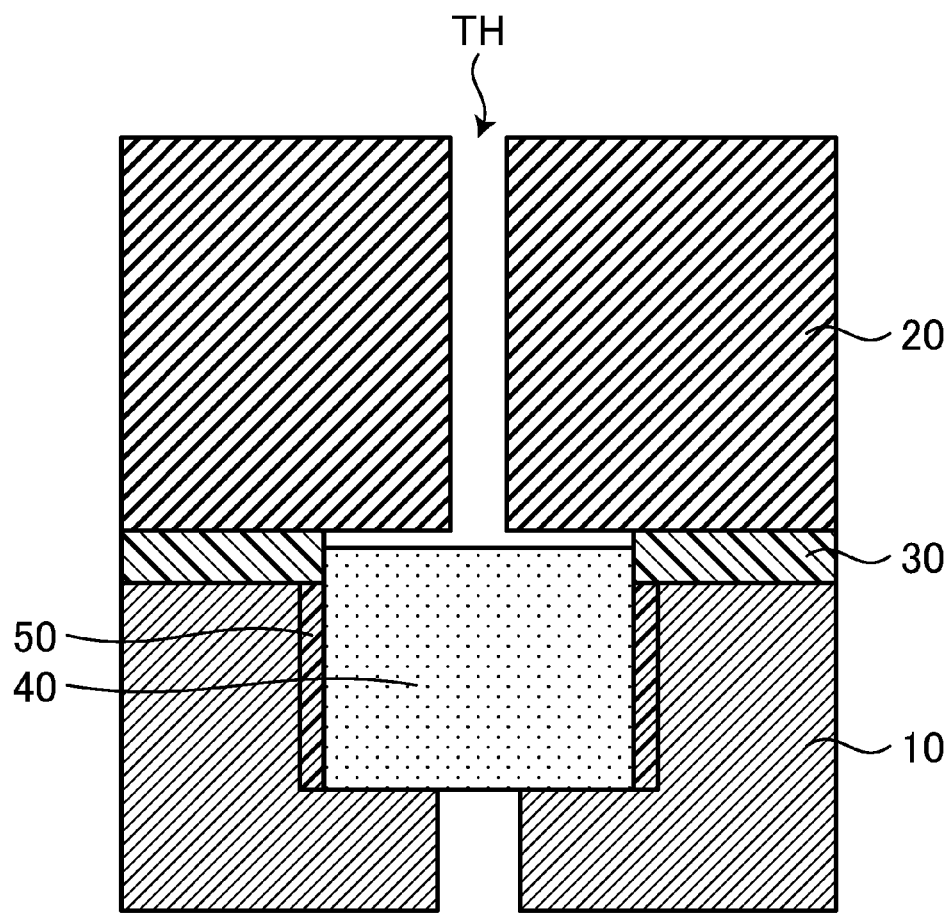
FIG. 11 is a view showing a structure example around a gas hole in the substrate fixing device.

FIG. 10 is a view showing a sixth modified embodiment of the substrate fixing device 100. In FIG. 10, the same parts as those in FIG. 3 are denoted with the same reference signs.

In the modified embodiment shown in FIG. 10, the substrate fixing device 100 has an insulating plug 160 of a sleeve type, instead of the porous insulating plug 140. The insulating plug 160 is an insulating sleeve having a through-hole 161 formed to communicate with the through-hole 112 of the base plate 110. The inert gas flowing into the through-hole 112 of the base plate 110 flows through the through-hole 161 of the insulating plug 160 into the through-hole 122 of the ceramic plate 120. In this way, even when the insulating plug 160 of the insulating sleeve, instead of the porous insulating plug 140, is arranged at the connection portion of the through-hole 112 and the through-hole 122, the inflow of the adhesive material 130 into the flow path of the gas can be prevented by the sealing member 150. The insulating sleeve can be formed using, for example, ceramic made of aluminum oxide, zirconium oxide, yttrium oxide, aluminum nitride or the like. In addition, the insulating sleeve may be formed using, for example, a resin material such as polyimide, fluorine-based resin, PEEK (polyether ether ketone) or polycarbonate.

Note that, the above embodiment and each modified embodiment can be variously combined and implemented. For example, by combining the fifth and sixth modified embodiments, the insulating plug 160 of the insulating sleeve may be arranged in the through-hole 112 of the base plate 110 and the porous plug 122a may be arranged in the through-hole 122 of the ceramic plate 120. In addition, it is possible to replace the porous plug 122a of the fifth modified embodiment with an insulating sleeve similar to the insulating plug 160.

What is claimed is:

1. A substrate fixing device comprising:
    a base plate having a first through-hole penetrating through the base plate in a thickness direction of the base plate;
    a ceramic plate adhering to the base plate, having an electrode embedded in the ceramic plate and a second through-hole formed to communicate with the first through-hole, and configured to adsorb an adsorption target object by an electrostatic force that is generated when a voltage is applied to the electrode;
    an insulating plug arranged at a connection portion in the first through-hole connecting to the second through-hole;
    a sealing member attached to the insulating plug and configured to seal a periphery of the connection portion; and
    an adhesive material configured to bond the base plate and the ceramic plate, the adhesive material being provided between the base plate and the ceramic plate,
    wherein
    the first through-hole has an opening portion connecting to the second through-hole at the connection portion, and a spot facing portion provided in the opening portion,
    the insulating plug is arranged in the spot facing portion,
    the sealing member is disposed to separate a space in which the insulating plug is arranged from a space in which the adhesive material is arranged, with the sealing member in contact with an entirety of a side surface of the adhesive material facing the first through-hole, and
    the sealing member has one end surface in a vertical direction in contact with a surface of the ceramic plate and the other end surface in the vertical direction in press contact with the insulating plug.

2. The substrate fixing device according to claim 1, wherein the insulating plug is fixed to the base plate without using an adhesive material in a state where the insulating plug is located in the spot facing portion of the first through-hole of the base plate.

3. The substrate fixing device according to claim 1, wherein the insulating plug has:
    a large-diameter portion having substantially the same diameter as that of the spot facing portion of the first through-hole, and
    a small-diameter portion overlapping the large-diameter portion and having a diameter smaller than the large-diameter portion, and
    wherein the sealing member has a through-hole through which the small-diameter portion is inserted.

4. The substrate fixing device according to claim 3, wherein the large-diameter portion has a cylindrical shape and is entirely accommodated in the spot facing portion.

5. The substrate fixing device according to claim 4, wherein the small-diameter portion has a cylindrical portion having a diameter smaller than the large-diameter portion.

6. The substrate fixing device according to claim 4, wherein the small-diameter portion has a truncated conical portion extending from the large-diameter portion in a tapered shape.

7. The substrate fixing device according to claim 4, wherein the small-diameter portion has a truncated conical portion extending from the large-diameter portion in a tapered shape, and a cylindrical portion overlapping the truncated conical portion.

8. The substrate fixing device according to claim 4, wherein the small-diameter portion has:
    a first cylindrical portion overlapping the large-diameter portion and having a diameter smaller than the large-diameter portion, and
    a second cylindrical portion overlapping the first cylindrical portion and having a diameter smaller than the first cylindrical portion.

9. The substrate fixing device according to claim 4, wherein the small-diameter portion has:
    a first cylindrical portion overlapping the large-diameter portion and having a diameter smaller than the large-diameter portion, and
    a second cylindrical portion overlapping the first cylindrical portion and having a diameter smaller than the large-diameter portion and larger than the first cylindrical portion.

10. The substrate fixing device according to claim 1, further comprising a porous plug arranged in the second through-hole and having a plurality of holes through which a gas passes.

11. The substrate fixing device according to claim 1, wherein the insulating plug is a porous body having a plurality of holes.

12. The substrate fixing device according to claim 1, wherein the insulating plug is an insulating sleeve having a through-hole formed to communicate with the first through-hole.

13. The substrate fixing device according to claim 1, wherein a gap is provided between the insulating plug and the ceramic plate in the thickness direction of the base plate.

* * * * *